(12) United States Patent
Wu

(10) Patent No.: US 11,984,898 B2
(45) Date of Patent: May 14, 2024

(54) COMPARATOR CIRCUIT HAVING FALSE-ALARM PREVENTING MECHANISM AND OPERATION METHOD OF THE SAME

(71) Applicant: REALTEK SEMICONDUCTOR CORPORATION, Hsinchu (TW)

(72) Inventor: Yen-Ting Wu, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/948,694

(22) Filed: Sep. 20, 2022

(65) Prior Publication Data
US 2023/0085814 A1    Mar. 23, 2023

(30) Foreign Application Priority Data
Sep. 22, 2021   (TW) .................................. 110135118

(51) Int. Cl.
*H03K 5/24*   (2006.01)

(52) U.S. Cl.
CPC .................................... *H03K 5/249* (2013.01)

(58) Field of Classification Search
CPC ........ H03K 5/249; H03K 5/2481; H03K 5/24; H03K 3/023; H03K 19/0963; H03K 2005/00215; H03K 3/356139; H03K 5/22; H03K 19/20; H03K 3/35613; H03K 3/037; H03K 3/356113; H03M 1/36; H03F 2203/45652; H03F 3/45183; H03F 3/45269; H03F 2203/45212; H03F 3/45475; H03F 3/45977
See application file for complete search history.

(56) References Cited

U.S. PATENT DOCUMENTS

| 8,736,310 B2* | 5/2014 | Cheong | H03F 3/45744 327/63 |
| 2005/0162193 A1* | 7/2005 | Payne | H03K 3/356173 327/52 |
| 2006/0226871 A1* | 10/2006 | Ito | H03K 3/356139 326/38 |
| 2022/0200588 A1* | 6/2022 | Chu | H03K 19/20 |

OTHER PUBLICATIONS

Lu et al. "A 10-bit 50-MS/s SAR ADC With a Monotonic Capacitor Switching Procedure", Apr. 2010, Journal of Solid-state circuits., vol. 45 No. 4, IEEE.

* cited by examiner

*Primary Examiner* — Lincoln D Donovan
*Assistant Examiner* — Tyler J Pereny
(74) *Attorney, Agent, or Firm* — WPAT. P.C

(57) ABSTRACT

The present invention discloses a comparator circuit having false-alarm preventing mechanism. An input pair circuit receives a first and a second input voltages from a first and a second input terminals in an the operation state. The input pair circuit and a latch circuit cooperate to perform comparison thereon in the operation state to generate a first and a second output voltages at a first and a second output terminals. A gate and a drain of a first latch transistor are electrically coupled to the first and the second output terminals respectively. A gate and a drain of a second latch transistor are electrically coupled to the second and the first output terminals respectively. A conduction adjusting circuit enhances the conduction of the latch circuit when being triggered. A voltage detection circuit triggers the conduction adjusting circuit when the first and the second output voltages are not within a predetermined range.

14 Claims, 4 Drawing Sheets

COMPARATOR CIRCUIT HAVING FALSE-ALARM PREVENTING MECHANISM AND OPERATION METHOD OF THE SAME

BACKGROUND OF THE INVENTION

1. Field of the Invention

The present invention relates to a comparator circuit having false-alarm preventing mechanism and an operation method of the same.

2. Description of Related Art

In modern electronic circuit technologies, a comparator circuit is developed to compare two analog input signals and generate a digital output signal accordingly. The digital output signal is a comparison result that identifies which one of the two analog input signals is larger. The comparator circuit is a non-linear circuit that digitalizes the analog signals and is able to cooperate with a latch circuit to store the value of the digital output signal described above.

However, when the latch circuit is in operation, an output terminal that generates the comparison result is initialized in a meta-stable state and turns to a stable state after a certain period of time. If the transition time between the meta-stable state and the stable state becomes too long, a false alarm is easily generated.

SUMMARY OF THE INVENTION

In consideration of the problem of the prior art, an object of the present invention is to supply a comparator circuit having false-alarm preventing mechanism and an operation method of the same.

The present invention discloses a comparator circuit having false-alarm preventing mechanism that includes an input pair circuit, a latch circuit, a conduction adjusting circuit and a voltage detection circuit. The input pair circuit corresponds to a first input terminal, a second input terminal, a first output terminal and a second output terminal, and is configured to receive a first input voltage and a second input voltage respectively from the first input terminal and the second input terminal. The input pair circuit and the latch circuit cooperate to perform comparison on the first input voltage and the second input voltage in an the operation state, to generate a first output voltage and a second output voltage respectively at the first output terminal and the second output terminal, in which the latch circuit includes a first latch transistor and a second latch transistor. The first latch transistor has a gate electrically coupled to the first output terminal and a drain electrically coupled to the second output terminal. The second latch transistor has a gate electrically coupled to the second output terminal and a drain electrically coupled to the first output terminal. The conduction adjusting circuit is configured to enhance the conduction of the latch circuit when being triggered. The voltage detection circuit is configured to detect the first output voltage and the second output voltage, so as to trigger the conduction adjusting circuit when the first output voltage and the second output voltage are not within a predetermined range.

The present invention also discloses a comparator circuit operation method having false-alarm preventing mechanism that includes steps outlined below. A first input voltage and a second input voltage are received by an input pair circuit respectively from a first input terminal and a second input terminal of the input pair circuit. The input pair circuit and a latch circuit are made to cooperate in an the operation state to perform comparison on the first input voltage and the second input voltage to generate a first output voltage and a second output voltage respectively at a first output terminal and a second output terminal of the input pair circuit, wherein the latch circuit includes a first latch transistor and a second latch transistor, the first latch transistor having a gate electrically coupled to the first output terminal and a drain electrically coupled to the second output terminal, the second latch transistor having a gate electrically coupled to the second output terminal and a drain electrically coupled to the first output terminal. The first output voltage and the second output voltage are detected by the voltage detection circuit to trigger a conduction adjusting circuit when the first output voltage and the second output voltage are not within a predetermined range. The conduction of the latch circuit is enhanced by the conduction adjusting circuit when being triggered.

These and other objectives of the present invention will no doubt become obvious to those of ordinary skill in the art behind reading the following detailed description of the preferred embodiments that are illustrated in the various figures and drawings.

DETAILED DESCRIPTION OF THE PREFERRED EMBODIMENTS

An aspect of the present invention is to provide a comparator circuit having false-alarm preventing mechanism and an operation method of the same to dispose a voltage detection circuit and a conduction adjusting circuit to detect the voltages at the output terminals between the input pair circuit and the latch circuit such that the conduction adjusting circuit is triggered when the voltages at the output terminals are not within a predetermined range to enhance the conduction of the latch circuit, so as to adjust the voltages at the output terminals to prevent the false alarm.

Figure 1:
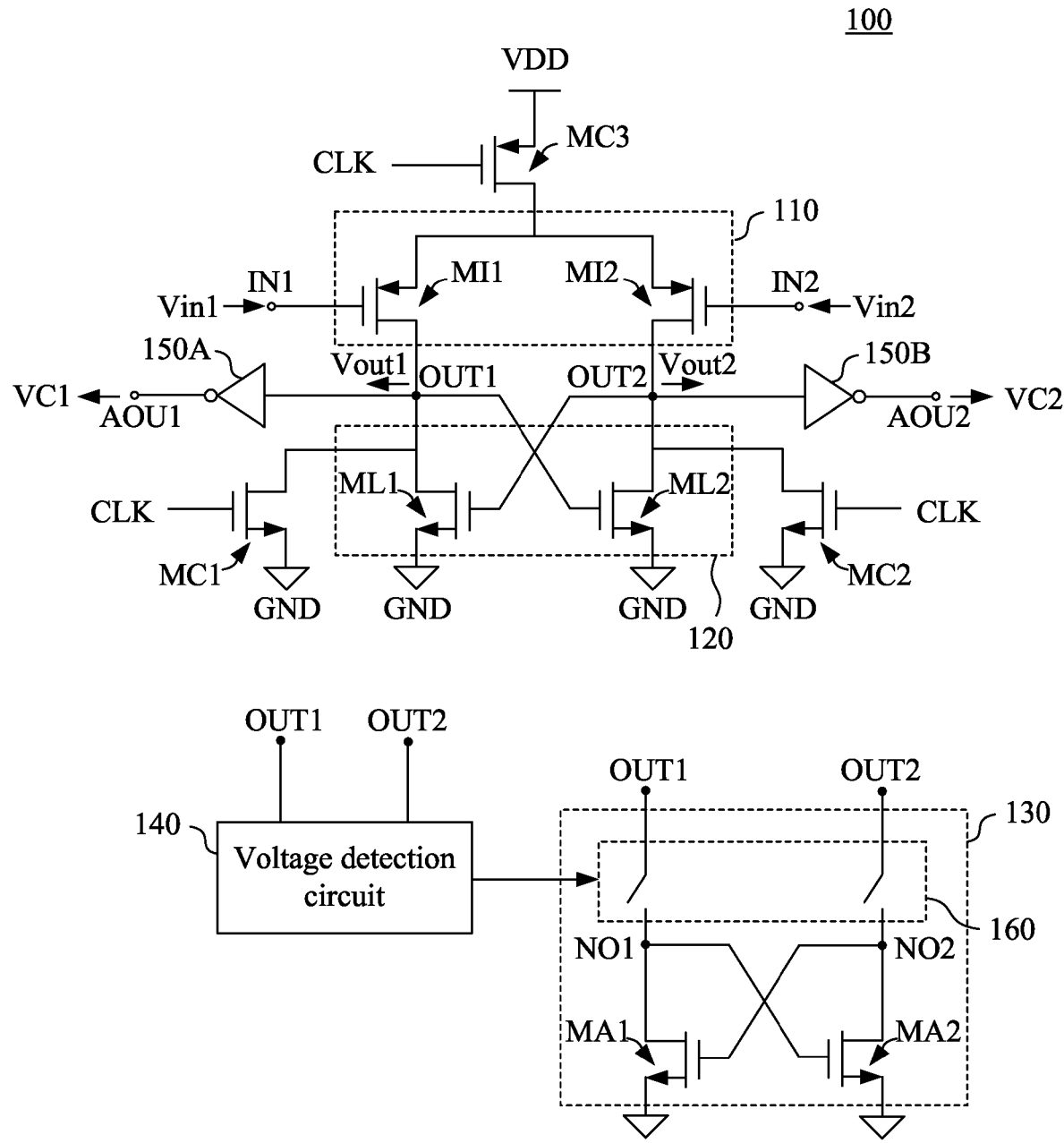
FIG. 1 illustrates a circuit diagram of a comparator circuit having false-alarm preventing mechanism according to an embodiment of the present invention.

Reference is now made to FIG. 1. FIG. 1 illustrates a circuit diagram of a comparator circuit 100 having false-alarm preventing mechanism according to an embodiment of the present invention. The comparator circuit 100 includes an input pair circuit 110, a latch circuit 120, a conduction adjusting circuit 130 and a voltage detection circuit 140.

The input pair circuit 110 corresponds to a first input terminal IN1, a second input terminal IN2, a first output terminal OUT1 and a second output terminal OUT2.

In an embodiment, the input pair circuit 110 includes a first input transistor MI1 and a second input transistor MI2. In the present embodiment, the input pair circuit 110 is a P-type transistor circuit, and each of the first input transistor MI1 and the second input transistor MI2 is a P-type transistor.

The first input transistor MI1 has a gate, a drain and a source. The gate is electrically coupled to the first input terminal IN1. The drain is electrically coupled to the first output terminal OUT1. The second input transistor MI2 also has a gate, a drain and a source. The gate is electrically coupled to the second input terminal IN2. The drain is electrically coupled to the second output terminal OUT2.

The latch circuit 120 includes a first latch transistor ML1 and a second latch transistor ML2. In the present embodiment, each of the first latch transistor ML1 and the second latch transistor ML2 is an N-type transistor.

The first latch transistor ML1 has a gate, a drain and a source. The gate is electrically coupled to the first output terminal OUT1. The drain is electrically coupled to the second output terminal OUT2. The source is electrically coupled to a first power supply terminal. In the present embodiment, the first power supply terminal is a ground terminal GND. The second latch transistor ML2 also has a gate, a drain and a source. The gate is electrically coupled to the second output terminal OUT2. The drain is electrically coupled to the first output terminal OUT1. The source is electrically coupled to the first power supply terminal.

In an embodiment, the comparator circuit 100 selectively includes a first output inverter 150A and a second output inverter 150B. The first output inverter 150A is electrically coupled to the first output terminal OUT1, to invert and output a voltage at the first output terminal OUT1 to a first actual output terminal AOU1. The second output inverter 150B is electrically coupled to the second output terminal OUT2, to invert and output a voltage at the second output terminal OUT2 to a second actual output terminal AOU2.

The conduction adjusting circuit 130 is configured to enhance the conduction of the latch circuit 120 when being triggered. In an embodiment, the conduction adjusting circuit 130 includes a first conduction adjusting transistor MA1, a second conduction adjusting transistor MA2 and a switch circuit 160.

The first conduction adjusting transistor MA1 has a gate, a drain and a source. The gate is electrically coupled to a first connection terminal NO1. The drain is electrically coupled to a second connection terminal NO2. The source is electrically coupled to the first power supply terminal. The second conduction adjusting transistor MA2 has a gate, a drain and a source. The gate is electrically coupled to the second connection terminal NO2. The drain is electrically coupled to the first connection terminal NO1. The source is electrically coupled to the first power supply terminal.

When being triggered, the switch circuit 160 electrically couples the first connection terminal NO1 to the first output terminal OUT1 and electrically couples the second connection terminal NO2 to the second output terminal OUT2, such that the first conduction adjusting transistor MA1 and the first latch transistor ML1 are coupled in parallel, and the second conduction adjusting transistor MA2 and the second latch transistor ML2 are coupled in parallel.

Further, when not being triggered, the switch circuit 160 electrically isolates the first connection terminal NO1 from the first output terminal OUT1, and electrically isolates the second connection terminal NO2 from the second output terminal OUT2, such that the first conduction adjusting transistor MA1 and the first latch transistor ML1 are electrically isolated, and the second conduction adjusting transistor MA2 and the second latch transistor ML2 are electrically isolated.

The voltage detection circuit 140 is configured to detect voltages at the first output terminal OUT1 and the second output terminal OUT2, to determine whether the conduction adjusting circuit 130 is controlled to be triggered according to the voltages at the first output terminal OUT1 and the second output terminal OUT2. More specifically, the voltage detection circuit 140 actually determines whether the switch circuit 160 is controlled to be triggered according to the voltages at the first output terminal OUT1 and the second output terminal OUT2.

In an embodiment, the voltage detection circuit 140 is configured to trigger the conduction adjusting circuit 130 when the voltages at the first output terminal OUT1 and the second output terminal OUT2 are not within the predetermined range to enhance the conduction of the first latch transistor ML1 and the second latch transistor ML2. Further, the voltage detection circuit 140 is configured to not trigger the conduction adjusting circuit 130 when the voltages at the first output terminal OUT1 and the second output terminal OUT2 are within the predetermined range to not adjust the conduction of the first latch transistor ML1 and the second latch transistor ML2.

In the present embodiment, the voltage detection circuit 140 determines that the voltages at the first output terminal OUT1 and the second output terminal OUT2 are not within the predetermined range when each of these voltages is not smaller than a predetermined value.

It is appreciated that in FIG. 1, in order to make the diagram clear, the first output terminal OUT1 is labeled between the input pair circuit 110 and the latch circuit 120 and is also labeled at the conduction adjusting circuit 130 and the voltage detection circuit 140. However, these labels of the first output terminal OUT1 stand for a single terminal. Identical, the second output terminal OUT2 is labeled between the input pair circuit 110 and the latch circuit 120 and is also labeled at the conduction adjusting circuit 130 and the voltage detection circuit 140. These labels of the second output terminal OUT2 also stand for a single terminal.

The operation of the comparator circuit 100 is described in detail in the following paragraphs.

In an embodiment, the comparator circuit 100 selectively includes a first operation control transistor MC1, a second operation control transistor MC2 and a third operation control transistor MC3, to be switched according to a control clock signal CLK such that the comparator circuit 100 operates in a reset state and an operation state.

More specifically, the first operation control transistor MC1 is electrically coupled between the first output terminal OUT1 and the first power supply terminal. The second operation control transistor MC2 is electrically coupled between the second output terminal OUT2 and the first power supply terminal. The third operation control transistor MC3 is electrically coupled between the first power supply terminal and the input pair circuit 110. The first power supply terminal is a supply power VDD. The third operation control transistor MC3 is electrically coupled to between the supply power VDD and sources of the first input transistor MI1 and the second input transistor MI2.

In the present embodiment, each of the first operation control transistor MC1 and the second operation control transistor MC2 is an N-type transistor. The third operation control transistor MC3 is a P-type transistor.

In the reset state, the control clock signal CLK is at a high level. As a result, the first operation control transistor MC1 and the second operation control transistor MC2 are enabled according to the control clock signal CLK. The third operation control transistor MC3 is disabled according to the control clock signal CLK.

The input pair circuit 110 does not receive the power of the supply power VDD since the third operation control transistor MC3 is disabled. As a result, no matter what the voltages that the first input terminal IN1 and the second input terminal IN2 receive are, the input pair circuit 110 does not operate. However, the first output terminal OUT1 and the second output terminal OUT2 are reset to a low level since the first operation control transistor MC1 and the second operation control transistor MC2 are enabled.

The first output inverter 150A and the second output inverter 150B respectively invert and output the voltages at the first output terminal OUT1 and the second output terminal OUT2 such that the first actual output terminal AOU1 and the second actual output terminal AOU2 are reset to a high level.

Under such a condition, the voltage detection circuit 140 determines that the voltages of the first output terminal OUT1 and the second output terminal OUT2 are smaller than the predetermined value and are within the predetermined range since these voltages are at the low level. As a result, the voltage detection circuit 140 does not trigger the conduction adjusting circuit 130 and does not adjust the conduction of the first latch transistor ML1 and the second latch transistor ML2.

In the operation state, the control clock signal CLK is at the low level. As a result, the first operation control transistor MC1 and the second operation control transistor MC2 are disabled according to the control clock signal CLK. The third operation control transistor MC3 is enabled according to the control clock signal CLK.

The input pair circuit 110 receives the power of the supply power VDD since the third operation control transistor MC3 is enabled. The first output terminal OUT1 and the second output terminal OUT2 are not affected thereby since the first operation control transistor MC1 and the second operation control transistor MC2 are disabled.

Under such a condition, according to a first input voltage Vin1 received by the first input terminal IN1 and a second input voltage Vin2 received by the second input terminal IN2, the input pair circuit 110 and the latch circuit 120 cooperate to perform comparison on the first input voltage Vin1 and the second input voltage Vin2, to generate a first output voltage Vout1 at the first output terminal OUT1 and generate a second input voltage Vout2 at the second output terminal OUT2.

The first output inverter 150A further inverts and outputs the first output voltage Vout1 to the first actual output terminal AOU1 to become a first comparison result VC1. The second output inverter 150B further inverts and outputs the second input voltage Vout2 to the second actual output terminal AOU2 to become a second comparison result VC2.

In the present embodiment, when the first input voltage Vin1 is larger than the second input voltage Vin2, the first output voltage Vout1 becomes a low level voltage and the second input voltage Vout2 becomes a high level voltage. As a result, the first comparison result VC1 becomes a high level voltage. The second comparison result VC2 becomes a low level voltage.

When the first input voltage Vin1 is smaller than the second input voltage Vin2, the first output voltage Vout1 becomes a high level voltage and the second input voltage Vout2 becomes a low level voltage. As a result, the first comparison result VC1 becomes a low level voltage. The second comparison result VC2 becomes a high level voltage.

However, in the operation state, when the first input terminal IN1 and the second input terminal IN2 just receive the first input voltage Vin1 and the second input voltage Vin2, the latch circuit 120 makes the first output voltage Vout1 and the second input voltage Vout2 rise to a meta-stable state first and gradually become the stable state that is one of the high level voltage and the low level voltage later according to the relation of the amounts of the first input voltage Vin1 and the second input voltage Vin2. For one of the output voltages that supposes to become the low level voltage, if a decreasing speed of the voltage that decreases from the meta-stable state is too low such that the voltage is not low enough, an error is generated in the final comparison result.

As a result, the voltage detection circuit 140 detects the first input voltage Vin1 and the second input voltage Vin2 so as to trigger the conduction adjusting circuit 130 when the first input voltage Vin1 and the second input voltage Vin2 are not within the predetermined range.

As described above, in the present embodiment, the voltage detection circuit 140 determines that the voltages at the first input voltage Vin1 and the second input voltage Vin2 are not smaller than a predetermined value to further determine that these voltages are not within the predetermined range, so as to trigger the switch circuit 160 in the conduction adjusting circuit 130. The first conduction adjusting transistor MA1 and the first latch transistor ML1 are thus coupled in parallel, and the second conduction adjusting transistor MA2 and the second latch transistor ML2 are thus coupled in parallel.

By using the method described above, the first conduction adjusting transistor MA1 and the second conduction adjusting transistor MA2 in the conduction adjusting circuit 130 equivalently increase the W/L ratio of the first latch transistor ML1 and the second latch transistor ML2 to enhance the conduction of the latch circuit 120. The first output voltage Vout1 and the second input voltage Vout2 can be pulled low to speed up the process from the meta-stable state to the stable state, so as to prevent the generation of false trigger due to the false comparison result.

On the other hand, in the operation state, when the voltage detection circuit 140 detects and determines that the first input voltage Vin1 and the second input voltage Vin2 are within the predetermined range, the voltage detection circuit 140 does not trigger the conduction adjusting circuit 130 and does not adjust the conduction of the latch circuit 120.

As a result, the comparator circuit having false-alarm preventing mechanism of the present invention disposes the voltage detection circuit and the conduction adjusting circuit to detect the voltages at the output terminals between the input pair circuit and the latch circuit such that the conduction adjusting circuit is triggered when the voltages at the output terminals are not within a predetermined range to enhance the conduction of the latch circuit, so as to adjust the voltages at the output terminals to prevent the false alarm.

Figure 2:
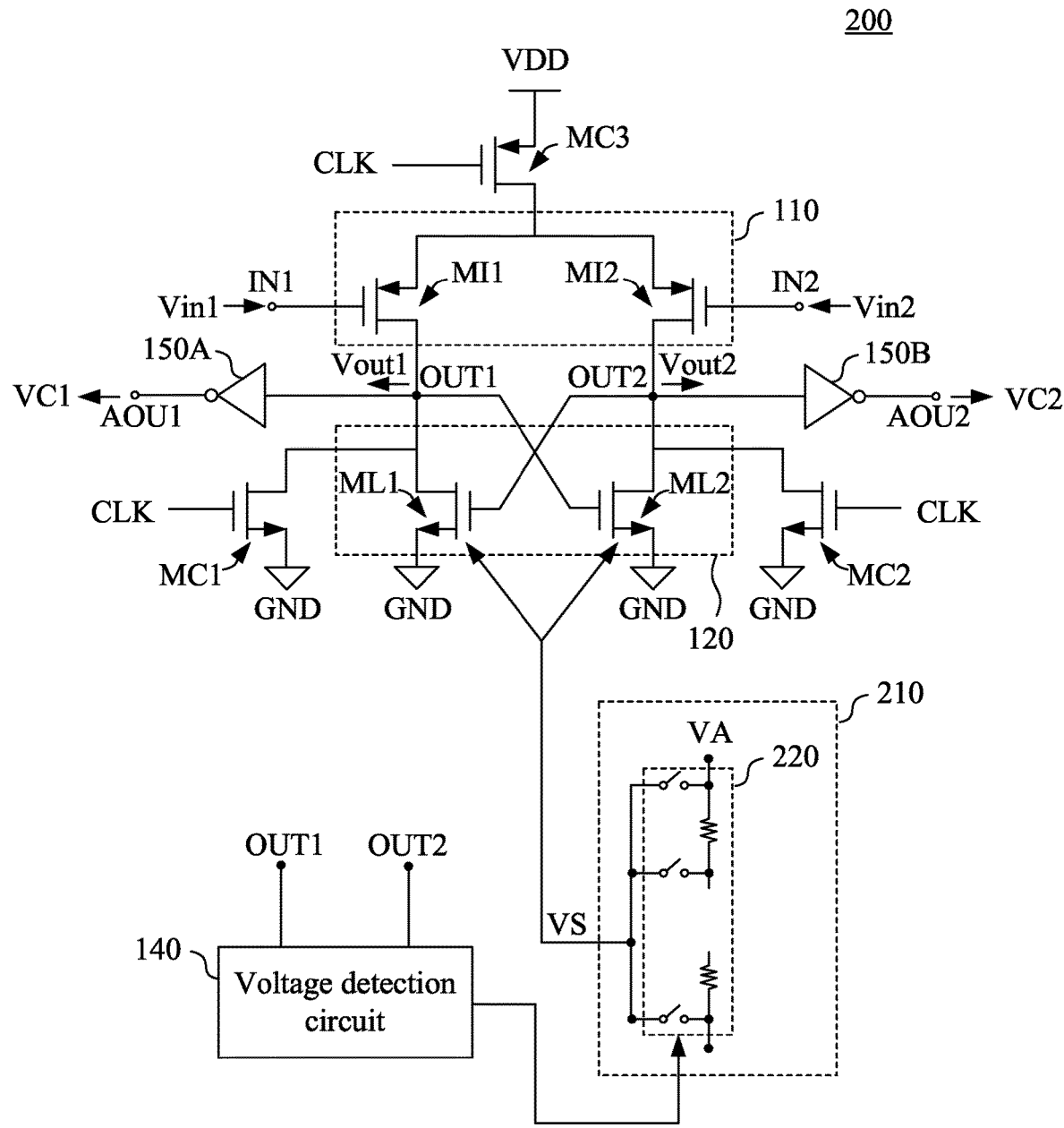
FIG. 2 illustrates a circuit diagram of a comparator circuit having false-alarm preventing mechanism according to another embodiment of the present invention.

Reference is now made to 2. FIG. 2 illustrates a circuit diagram of a comparator circuit 200 having false-alarm preventing mechanism according to another embodiment of the present invention. The comparator circuit 200 in FIG. 2 is similar to the comparator circuit 100 in FIG. 1 and includes the input pair circuit 110, the latch circuit 120 and the voltage detection circuit 140. As a result, the identical components are not described herein.

In the present embodiment, the comparator circuit 200 includes a conduction adjusting circuit 210, and the conduction adjusting circuit 210 is a voltage feeding circuit. In an embodiment, such a voltage feeding circuit includes a voltage source VA and a voltage dividing circuit 220. The voltage source VA is configured to generate a source voltage. The voltage dividing circuit 220 is configured to divide the source voltage VA to generate a feeding voltage VS.

The voltage detection circuit 140 is configured to trigger the voltage feeding circuit when the first input voltage Vin1 and the second input voltage Vin2 are not within the predetermined range, such that the feeding voltage VS has an enhancing level and is fed to the base of each of the first latch transistor ML1 and the second latch transistor ML2 to adjust a threshold voltage of each of the first latch transistor ML1 and the second latch transistor ML2. It is appreciated that in order to make the figure clear, the feeding voltage VS is illustrated to point at the first latch transistor ML1 and the second latch transistor ML2. Actually, the feeding voltage VS is transmitted to the base of each of the first latch transistor ML1 and the second latch transistor ML2.

In an embodiment, since each of the first latch transistor ML1 and the second latch transistor ML2 is an N-type transistor, the threshold voltage of each of the first latch transistor ML1 and the second latch transistor ML2 decreases when the feeding voltage VS is larger to enhance the conduction thereof.

On the other hand, the voltage detection circuit 140 does not feed the feeding voltage VS having the enhancing level to the base of each of the first latch transistor ML1 and the second latch transistor ML2 when the first input voltage Vin1 and the second input voltage Vin2 are within the predetermined range.

As a result, the comparator circuit 200 of the present embodiment can adjust the output terminal voltages by using the conduction adjusting circuit 210 implemented by the voltage feeding circuit when the output terminal voltages are not within the predetermined range to accomplish false-alarm preventing mechanism.

Figure 3:
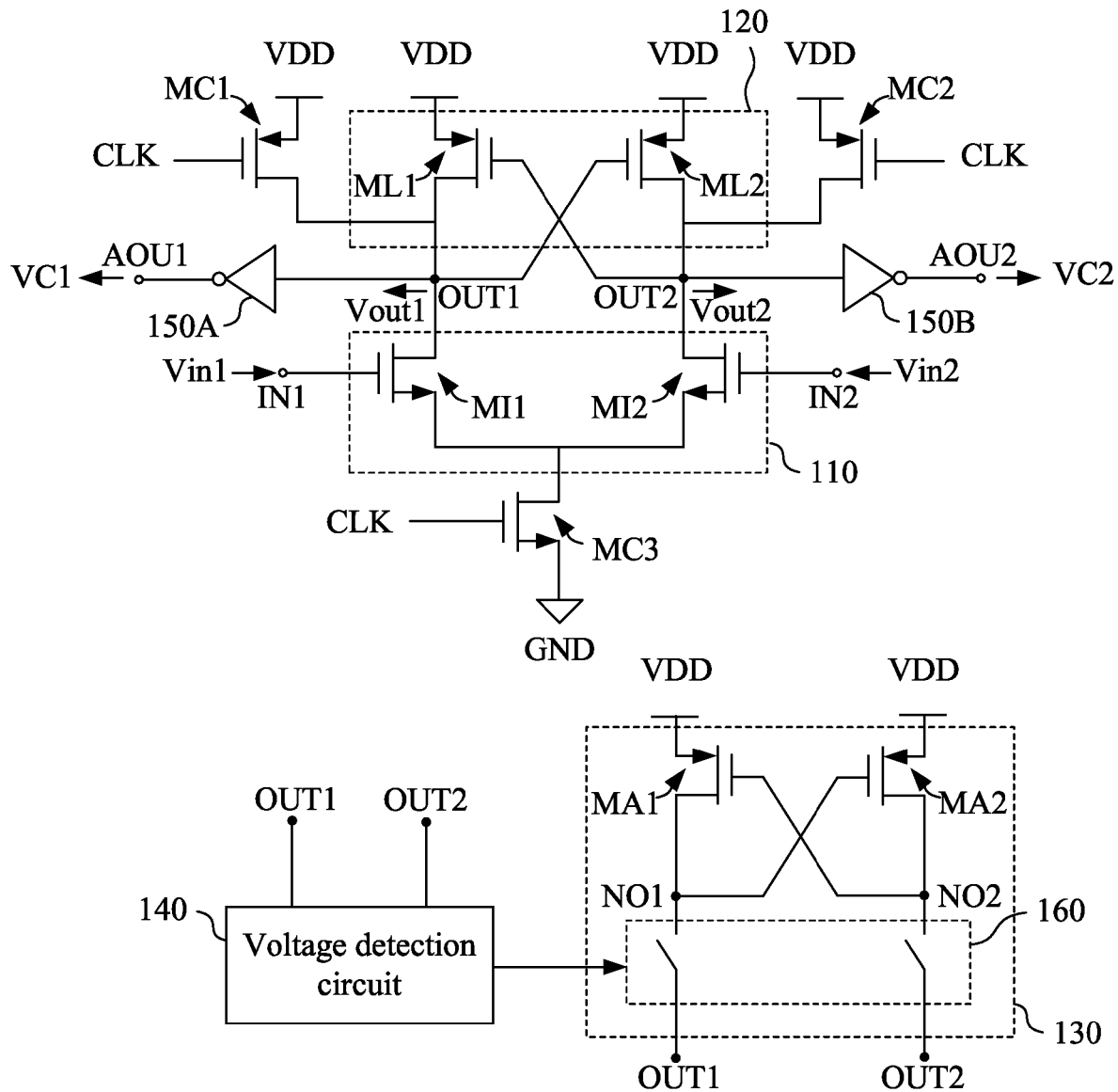
FIG. 3 illustrates a circuit diagram of a comparator circuit having false-alarm preventing mechanism according to yet another embodiment of the present invention.

Reference is now made to 3. FIG. 3 illustrates a circuit diagram of a comparator circuit having false-alarm preventing mechanism according to yet another embodiment of the present invention. The comparator circuit 300 in FIG. 3 is similar to the comparator circuit 100 in FIG. 1 and includes the input pair circuit 110, the latch circuit 120, the conduction adjusting circuit 130 and the voltage detection circuit 140.

In the present embodiment, the input pair circuit 110 is an N-type transistor circuit and includes the first input transistor MI1 and the second input transistor MI2 that are N-type transistors. The latch circuit 120 includes the first latch transistor ML1 and the second latch transistor ML2 that are P-type transistors.

Further, the conduction adjusting circuit 130 includes the first conduction adjusting transistor MA1 and the second conduction adjusting transistor MA2 that are P-type transistors. The first operation control transistor MC1 and the second operation control transistor MC2 are P-type transistors and the third operation control transistor MC3 is an N-type transistor. Further, the first power supply terminal is the supply power VDD. The second power supply terminal is the ground terminal GND.

As a result, the operation mechanism of the comparator circuit 300 is the inverse of the operation mechanism of the comparator circuit 100, in which the voltage detection circuit 140 determines that the first output voltage Vout1 and the second output voltage Vout2 are not within the predetermined range when these voltages are not larger than a predetermined value, so as to trigger the conduction adjusting circuit 130 to enhance the conduction of the latch circuit 120. The detail operation is not described herein.

It is appreciated that the conduction adjusting circuit 210 illustrated in FIG. 2 can also be applied to the configuration of FIG. 3 to adjust the output terminal voltages by applying a voltage to the base of each of the first latch transistor ML1 and the second latch transistor ML2 in the latch circuit 120 to accomplish the false-alarm preventing mechanism.

It is noted that only one conduction adjusting circuit 130 is illustrated in each of FIG. 1 and FIG. 3 and only one conduction adjusting circuit 210 is illustrated in FIG. 2. However, the comparator circuit 100 in FIG. 1 may include more than one conduction adjusting circuits 130, the comparator circuit 200 in FIG. 2 may include more than one conduction adjusting circuits 210, and the comparator circuit 300 in FIG. 3 may include more than one conduction adjusting circuits 130. The present invention is not limited thereto.

Figure 4:
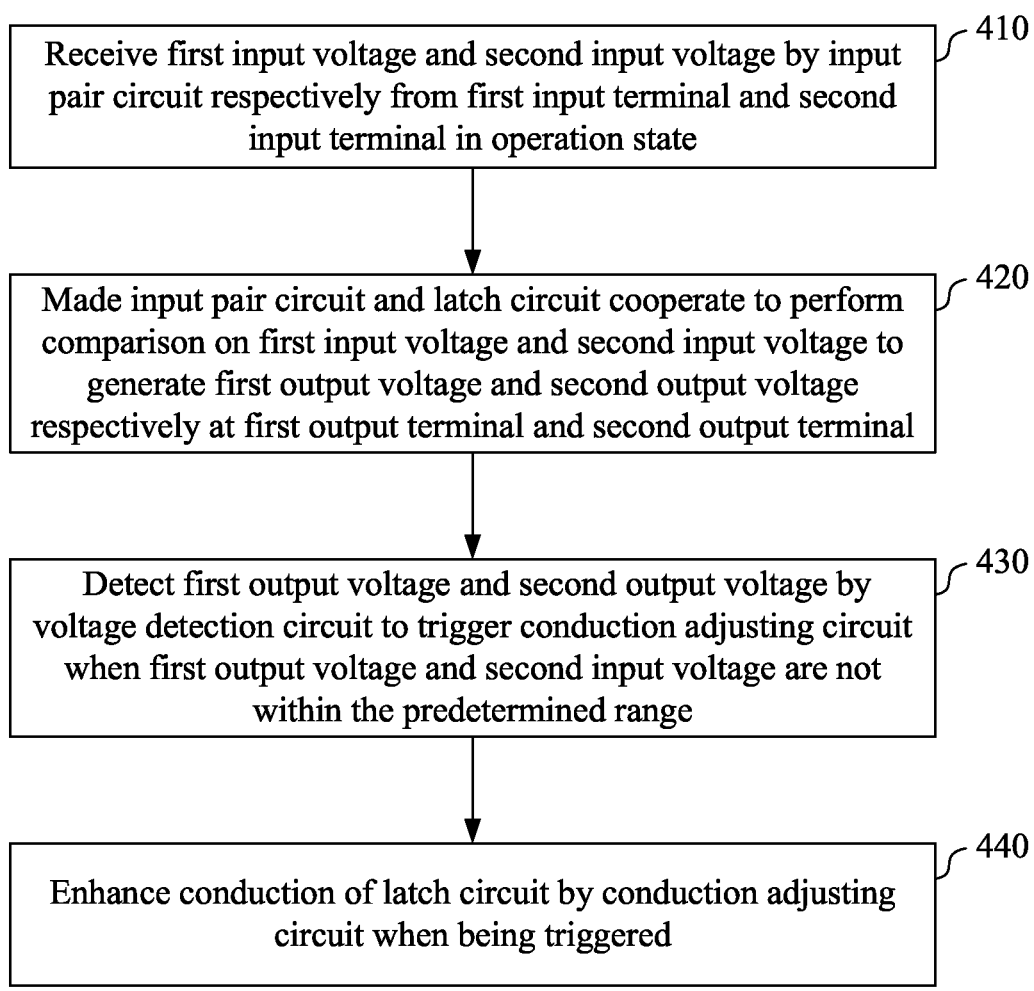
FIG. 4 illustrates a flow chart of a comparator circuit operation method having false-alarm preventing mechanism according to an embodiment of the present invention.

Reference is now made to FIG. 4. FIG. 4 illustrates a flow chart of a comparator circuit operation method 400 having false-alarm preventing mechanism according to an embodiment of the present invention.

In addition to the apparatus described above, the present disclosure further provides the comparator circuit operation method 400 having false-alarm preventing mechanism that can be used in such as, but not limited to, the comparator circuit 100 in FIG. 1. As illustrated in FIG. 4, an embodiment of the comparator circuit operation method 400 includes the following steps.

In step S410, the first input voltage Vin1 and the second input voltage Vin2 are received by the input pair circuit 110 respectively from the first input terminal IN1 and the second input terminal IN2 of the input pair circuit 110 in the operation state.

In step S420, the input pair circuit 110 and the latch circuit 120 are made to cooperate to perform comparison on the first input voltage Vin1 and the second input voltage Vin2 to generate the first output voltage Vout1 and the second output voltage Vout2 respectively at a first output terminal OUT1 and a second output terminal OUT2 of the input pair circuit 110.

In step S430, the first output voltage Vout1 and the second output voltage Vout2 are detected by the voltage detection circuit 140 to trigger the conduction adjusting circuit 130 when the first output voltage Vout1 and the second input voltage Vout2 are not within the predetermined range.

In step S440, the conduction of the latch circuit 120 is enhanced by the conduction adjusting circuit 130 when being triggered.

It is appreciated that the embodiments described above are merely an example. In other embodiments, it should be appreciated that many modifications and changes may be made by those of ordinary skill in the art without departing from the spirit of the disclosure.

In summary, the present invention discloses the comparator circuit having false-alarm preventing mechanism and the operation method of the same that dispose a voltage detection circuit and a conduction adjusting circuit to detect the voltages at the output terminals between the input pair circuit and the latch circuit such that the conduction adjusting circuit is triggered when the voltages at the output terminals are not within a predetermined range to enhance the conduction of the latch circuit, so as to adjust the voltages at the output terminals to prevent the false alarm.

The aforementioned descriptions represent merely the preferred embodiments of the present invention, without any intention to limit the scope of the present invention thereto.

Various equivalent changes, alterations, or modifications based on the claims of present invention are all consequently viewed as being embraced by the scope of the present invention.

What is claimed is:

1. A comparator circuit having false-alarm preventing mechanism comprising:
   an input pair circuit electrically coupled to a first input terminal, a second input terminal, a first output terminal and a second output terminal, and configured to receive a first input voltage and a second input voltage respectively from the first input terminal and the second input terminal;
   a latch circuit, wherein the input pair circuit and the latch circuit cooperate to perform comparison on the first input voltage and the second input voltage in an operation state, to generate a first output voltage and a second output voltage respectively at the first output terminal and the second output terminal, in which the latch circuit is electrically coupled to the input pair circuit through the first output terminal and the second output terminal and comprises:
      a first latch transistor having a gate electrically coupled to the first output terminal and a drain electrically coupled to the second output terminal; and
      a second latch transistor having a gate electrically coupled to the second output terminal and a drain electrically coupled to the first output terminal;
   a conduction adjusting circuit configured to enhance the conduction of the latch circuit when being triggered, wherein the conduction adjusting circuit comprises:
      a first conduction adjusting transistor having a gate electrically coupled to a first connection terminal and a drain electrically coupled to a second connection terminal;
      a second conduction adjusting transistor having a gate electrically coupled to the second connection terminal and a drain electrically coupled to the first connection terminal; and
      a switch circuit; and
   a voltage detection circuit configured to detect the first output voltage and the second output voltage, so as to trigger the conduction adjusting circuit when the first output voltage and the second output voltage are not within a predetermined range, wherein the voltage detection circuit is further configured to:
      trigger the switch circuit when the first output voltage and the second input voltage are not within the predetermined range, to electrically couple the first connection terminal to the first output terminal and electrically couple the second connection terminal to the second output terminal, such that the first conduction adjusting transistor and the first latch transistor are coupled in parallel, and the second conduction adjusting transistor and the second latch transistor are coupled in parallel; and
      not trigger the switch circuit when the first output voltage and the second input voltage are within the predetermined range, to electrically isolate the first connection terminal from the first output terminal and electrically isolate the second connection terminal from the second output terminal, such that the first conduction adjusting transistor and the first latch transistor are electrically isolated, and the second conduction adjusting transistor and the second latch transistor are electrically isolated.

2. The comparator circuit of claim 1, wherein the input pair circuit comprises:
   a first input transistor having a gate electrically coupled to the first input terminal and a drain electrically coupled to the first output terminal; and
   a second input transistor having a gate electrically coupled to the second input terminal and a drain electrically coupled to the second output terminal.

3. The comparator circuit of claim 1, wherein each of the first latch transistor and the second latch transistor is an N-type transistor, and the input pair circuit is a P-type transistor circuit, the voltage detection circuit is configured to make the conduction adjusting circuit enhance the conduction of the latch circuit when the first output voltage and the second input voltage are not smaller than a predetermined value.

4. The comparator circuit of claim 1, wherein each of the first latch transistor and the second latch transistor is a P-type transistor, and the input pair circuit is an N-type transistor circuit, the voltage detection circuit is configured to make the conduction adjusting circuit enhance the conduction of the latch circuit when the first output voltage and the second input voltage are not larger than a predetermined value.

5. The comparator circuit of claim 1, wherein the first latch transistor further comprises a source electrically coupled to a first power supply terminal, and the second latch transistor comprises a source electrically coupled to the first power supply terminal, the comparator circuit further comprises:
   a first operation control transistor electrically coupled between the first output terminal and the first power supply terminal;
   a second operation control transistor electrically coupled between the second output terminal and the first power supply terminal; and
   a third operation control transistor electrically coupled between a second power supply terminal and the input pair circuit;
   wherein in a reset state, the first operation control transistor and the second operation control transistor are enabled according to a control clock signal, and the third operation control transistor is disabled according to the control clock signal;
   in the operation state, the first operation control transistor and the second operation control transistor are disabled according to the control clock signal, and the third operation control transistor is enabled according to the control clock signal.

6. The comparator circuit of claim 1, further comprising:
   a first output inverter electrically coupled to the first output terminal and configured to output a first comparison result to a first actual output terminal according to the first output voltage; and
   a second output inverter electrically coupled to the second output terminal and configured to output a second comparison result to a second actual output terminal according to the second input voltage.

7. A comparator circuit operation method having false-alarm preventing mechanism comprising:
   receiving a first input voltage and a second input voltage by an input pair circuit respectively from a first input terminal and a second input terminal of the input pair circuit;
   making the input pair circuit and a latch circuit to cooperate in an operation state to perform comparison on the first input voltage and the second input voltage to generate a first output voltage and a second output voltage respectively at a first output terminal and a second output terminal of the input pair circuit, wherein the latch circuit is electrically coupled to the input pair circuit through the first output terminal and the second output terminal and comprises a first latch transistor and a second latch transistor, the first latch transistor having a gate electrically coupled to the first output terminal and a drain electrically coupled to the second output terminal, the second latch transistor having a gate electrically coupled to the second output terminal and a drain electrically coupled to the first output terminal;

detecting the first output voltage and the second output voltage by the voltage detection circuit to trigger a conduction adjusting circuit when the first output voltage and the second output voltage are not within a predetermined range, wherein the conduction adjusting circuit comprises a first conduction adjusting transistor having a gate electrically coupled to a first connection terminal and a drain electrically coupled to a second connection terminal, a second conduction adjusting transistor having a gate electrically coupled to the second connection terminal and a drain electrically coupled to the first connection terminal and a switch circuit, and wherein the voltage detection circuit is further configured to:

trigger the switch circuit when the first output voltage and the second input voltage are not within the predetermined range, to electrically couple the first connection terminal to the first output terminal and electrically couple the second connection terminal to the second output terminal, such that the first conduction adjusting transistor and the first latch transistor are coupled in parallel, and the second conduction adjusting transistor and the second latch transistor are coupled in parallel; and not trigger the switch circuit when the first output voltage and the second input voltage are within the predetermined range, to electrically isolate the first connection terminal from the first output terminal and electrically isolate the second connection terminal from the second output terminal, such that the first conduction adjusting transistor and the first latch transistor are electrically isolated, and the second conduction adjusting transistor and the second latch transistor are electrically isolated; and enhancing the conduction of the latch circuit by the conduction adjusting circuit when being triggered.

8. The comparator circuit operation method of claim 7, wherein the input pair circuit comprises:

a first input transistor having a gate electrically coupled to the first input terminal and a drain electrically coupled to the first output terminal; and a second input transistor having a gate electrically coupled to the second input terminal and a drain electrically coupled to the second output terminal.

9. The comparator circuit operation method of claim 7, wherein each of the first latch transistor and the second latch transistor is an N-type transistor, and the input pair circuit is a P-type transistor circuit, the comparator circuit operation method comprises:

making the conduction adjusting circuit enhance the conduction of the latch circuit by the voltage detection circuit when the first output voltage and the second input voltage are not smaller than a predetermined value.

10. The comparator circuit operation method of claim 7, wherein each of the first latch transistor and the second latch transistor is a P-type transistor, and the input pair circuit is an N-type transistor circuit, the comparator circuit operation method comprises:

making the conduction adjusting circuit enhance the conduction of the latch circuit by voltage detection circuit when the first output voltage and the second input voltage are not larger than a predetermined value.

11. The comparator circuit operation method of claim 7, wherein the first latch transistor further comprises a source electrically coupled to a first power supply terminal, and the second latch transistor comprises a source electrically coupled to the first power supply terminal, the comparator circuit further comprises a first operation control transistor electrically coupled between the first output terminal and the first power supply terminal, a second operation control transistor electrically coupled between the second output terminal and the first power supply terminal and a third operation control transistor electrically coupled between a second power supply terminal and the input pair circuit, the comparator circuit operation method further comprises:

in a reset state, enabling the first operation control transistor and the second operation control transistor according to a control clock signal, and disabling the third operation control transistor according to the control clock signal;

in the operation state, disabling the first operation control transistor and the second operation control transistor according to the control clock signal, and enabling the third operation control transistor according to the control clock signal.

12. The comparator circuit operation method of claim 7, further comprising:

outputting a first comparison result to a first actual output terminal by a first output inverter electrically coupled to the first output terminal according to the first output voltage; and outputting a second comparison result to a second actual output terminal by a second output inverter electrically coupled to the second output terminal according to the second input voltage.

13. A comparator circuit having false-alarm preventing mechanism comprising:

an input pair circuit electrically coupled to a first input terminal, a second input terminal, a first output terminal and a second output terminal, and configured to receive a first input voltage and a second input voltage respectively from the first input terminal and the second input terminal;

a latch circuit, wherein the input pair circuit and the latch circuit cooperate to perform comparison on the first input voltage and the second input voltage in an operation state, to generate a first output voltage and a second output voltage respectively at the first output terminal and the second output terminal, in which the latch circuit is electrically coupled to the input pair circuit through the first output terminal and the second output terminal and comprises:

a first latch transistor having a gate electrically coupled to the first output terminal and a drain electrically coupled to the second output terminal; and a second latch transistor having a gate electrically coupled to the second output terminal and a drain electrically coupled to the first output terminal;

a conduction adjusting circuit configured to enhance the conduction of the latch circuit when being triggered, wherein the conduction adjusting circuit is a voltage feeding circuit; and a voltage detection circuit configured to detect the first output voltage and the second output voltage, so as to trigger the conduction adjusting circuit when the first output voltage and the second output voltage are not within a predetermined range, wherein the voltage detection circuit is further configured to:

trigger the voltage feeding circuit when the first output voltage and the second input voltage are not within the predetermined range, to feed a feeding voltage having an enhancing level to a base of each of the first latch transistor and the second latch transistor, so as to adjust a threshold voltage of each of the first latch transistor and the second latch transistor; and not trigger the voltage feeding circuit when the first output voltage and the second input voltage are within the predetermined range, to not feed the feeding voltage having the enhancing level to the base.

14. The comparator circuit of claim 13, wherein the voltage feeding circuit comprises:

a voltage source configured to generate a source voltage; and a voltage dividing circuit configured to divide the source voltage to generate the feeding voltage.

\* \* \* \* \*